(12) United States Patent
Chen et al.

(10) Patent No.: US 9,095,943 B2
(45) Date of Patent: Aug. 4, 2015

(54) APPARATUS FOR ASSEMBLING CAMERA MODULES

(71) Applicants:HONG FU JIN PRECISION INDUSTRY (ShenZhen) CO., LTD., Shenzhen (CN); HON HAI PRECISION INDUSTRY CO., LTD., New Taipei (TW)

(72) Inventors: Wen-Chang Chen, New Taipei (TW); Shin-Wen Chen, New Taipei (TW); Yu-Tsan Cheng, New Taipei (TW); Yu-Shu Lin, New Taipei (TW); Chien-Liang Chou, New Taipei (TW); Zuo-Qing Yao, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 225 days.

(21) Appl. No.: 13/726,654

(22) Filed: Dec. 26, 2012

(65) Prior Publication Data

US 2014/0059822 A1     Mar. 6, 2014

(30) Foreign Application Priority Data

Sep. 5, 2012   (CN) .......................... 2012 1 0324453

(51) Int. Cl.
*B23P 19/00* (2006.01)
*H05K 13/04* (2006.01)
*B23P 21/00* (2006.01)

(52) U.S. Cl.
CPC .......... *B23P 21/004* (2013.01); *H05K 13/0434* (2013.01); *Y10T 29/4913* (2015.01); *Y10T 29/5124* (2015.01); *Y10T 29/5135* (2015.01); *Y10T 29/5137* (2015.01); *Y10T 29/53174* (2015.01); *Y10T 29/53187* (2015.01)

(58) Field of Classification Search
CPC .............. B23P 21/004; H05K 13/0434; Y10T 29/5124; Y10T 29/5135; Y10T 29/5137; Y10T 29/53174; Y10T 29/53187; Y10T 29/4913
USPC ................. 206/701, 713, 714, 716, 722, 725; 29/38.9, 563, 564.1, 830, 832, 739, 29/742
See application file for complete search history.

(56) References Cited

U.S. PATENT DOCUMENTS

| | | | |
|---|---|---|---|
| 6,101,790 A * | 8/2000 | Mori et al. ...................... | 53/453 |
| 7,895,739 B2 * | 3/2011 | Niklas et al. .................... | 29/832 |
| 2009/0167868 A1 * | 7/2009 | Knoedgen et al. ............ | 348/187 |
| 2012/0076631 A1 * | 3/2012 | Wang et al. ................. | 414/792.7 |

* cited by examiner

*Primary Examiner* — Livius R Cazan
(74) *Attorney, Agent, or Firm* — Novak Druce Connolly Bove + Quigg LLP

(57) ABSTRACT

An apparatus for assembling camera modules to flexible printed circuit boards (PCBs) includes a number of trays, a surface mounting device used in surface mount technology (SMT) for PCBs, and a hot pressing device. Workpieces, each of which includes a flexible PCB (FPCB) and a lens module positioned on the FPCB, are received in the trays. Each tray is sent to the surface mounting device. The surface mounting device loads and pastes a stiffener onto a FBCB, opposite to a lens module. The hot pressing device hot presses each stiffener to the respective workpiece, which is received in each tray sent from the surface mounting device, to fixedly secure the stiffener to the respective workpiece to form a camera module.

10 Claims, 2 Drawing Sheets

APPARATUS FOR ASSEMBLING CAMERA MODULES

BACKGROUND

1. Technical Field

The present disclosure relates to manufacturing of camera modules and, particularly, to an apparatus for assembling camera modules.

2. Description of Related Art

Camera modules include a flexible printed circuit board (FPCB) and a lens module positioned on the FPCB. To reinforce mechanical strength of the FPCB and provide electromagnetic interference (EMI) shielding, the camera module often further includes a stiffener pasted to a surface of the FPCB opposite to the lens module. At present, the stiffener is manually pasted to the FPCB, which is inefficient.

Therefore, it is desirable to provide an apparatus for assembling camera modules, which can overcome the above-mentioned problems.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure.

DETAILED DESCRIPTION

Embodiments of the present disclosure will be described with reference to the drawings.

Figure 1:
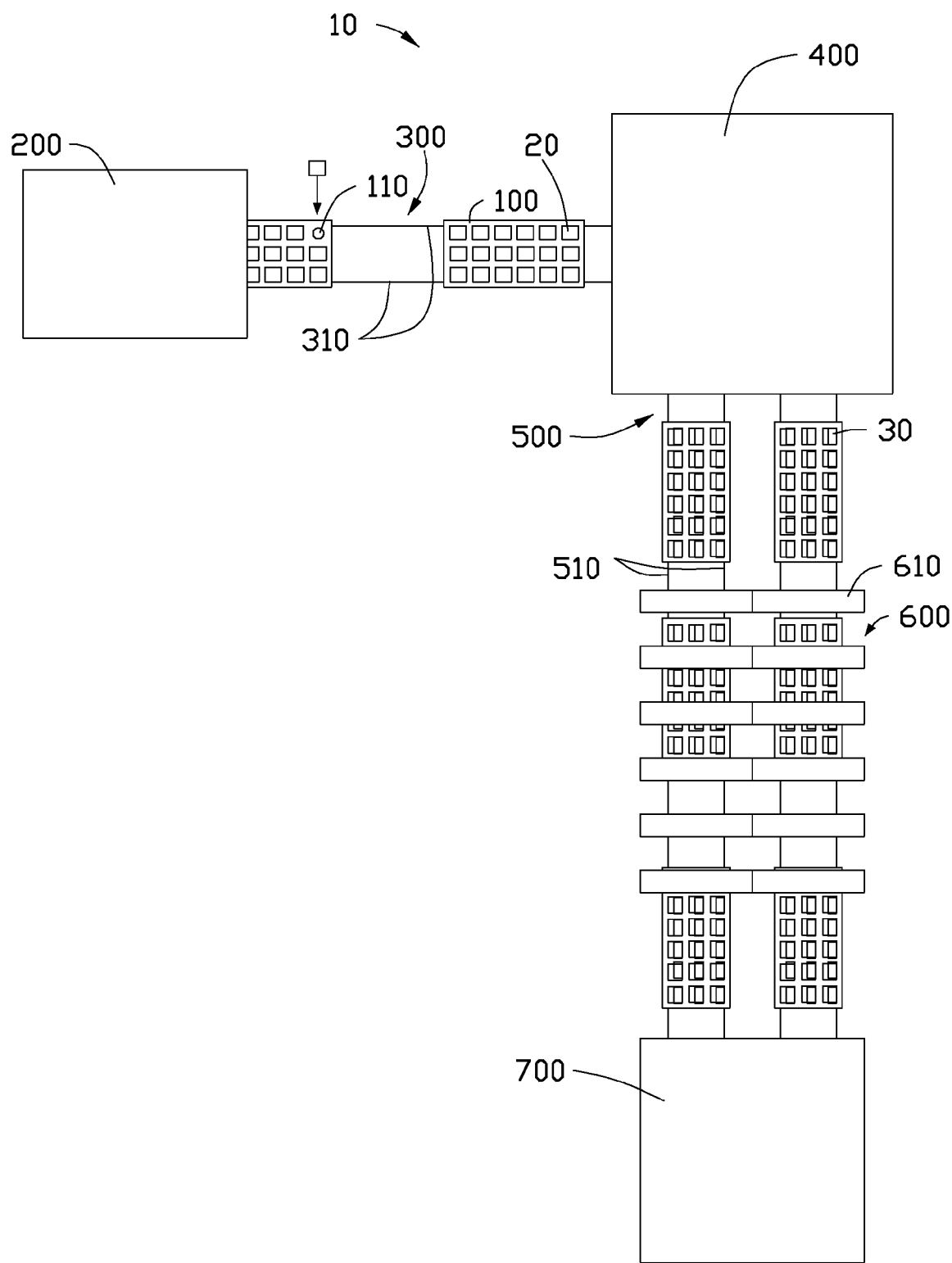
FIG. 1 is a plan schematic view of an apparatus for assembling camera modules, according to an embodiment.

Referring to FIG. 1, an apparatus 10, according to an embodiment, includes a number of trays 100, a tray sender 200, a first transferring device 300, a surface mounting device 400, a second transferring device 500, a hot pressing device 600, and a tray collector 700. Each tray 100 receives a number of workpieces 20, each of which includes an FPCB 21 and a lens module 22 positioned on the FPCB 21 (see FIG. 2). The tray sender 200 sends each tray 100 into the first transferring device 300. The first transferring device 300 transfers each tray 100 from the tray sender 200 to the surface mounting device 400. The surface mounting device 400 is configured to load a number of stiffeners 30, which is packaged in a tape, and configured to paste each stiffener 30 to a corresponding workpiece 20. The second transferring device 500 transfers each tray 100 from the surface mounting device 400 to the tray collector 700. The hot pressing device 600 is located between the surface mounting device 400 and the collector 700 and applies a hot pressing to each stiffener 30 to fixedly secure the stiffener 30 to the workpiece 20, to form a camera module. The tray collector 700 collects the trays 100.

Each tray 100 defines an array of receiving holes 110. Each receiving hole 110 receives a lens module 21. In this embodiment, the array of receiving holes 110 has three columns and six rows. A column direction of each array of the receiving holes 110 is substantially parallel with a transferring direction of each tray 100 from the tray sender 200 to the first transferring device 300, to the surface mounting device 400, to the second transferring device 500, to the hot pressing device 600, and to the tray collector 700.

The tray sender 200 can be a tray sender used in surface mount technology (SMT) for printed circuit boards (PCBs).

The first transferring device 300 can be a transferring device used in SMT for PCBs and includes a pair of first belts 310. A distance between the pair of first belts 310 is substantially equal to a width of each tray 100 (i.e., a length of the tray 100 along a row direction of the array of the receiving holes 110). The first belts 310 support and transfer the trays 100 from the tray sender 200 to the surface mounting device 400.

The surface mounting device 400 can be a surface mounting device used in SMT for PCBs. Elements, such as resistors, capacitors, and chips, which are usually packaged in tapes suitable for mounting to desired positions of PCBs by the surface mounting device 400, are in this disclosure replaced with the stiffeners 30, and the PCBs are replaced with the trays 100. In this situation, the stiffeners 30 can be precisely, but automatically, pasted to the workpieces 20.

The second transferring device 500 can be a transferring device used in SMT for PCB and includes two pairs of second belts 510. A distance between each pair of second belts 510 is substantially equal to the width of each tray 100. Each pair of second belts 510 support and transfer the trays 100 from the surface mounting device 400, through the hot pressing device 600 and process, and on to the tray collector 700.

Figure 2:
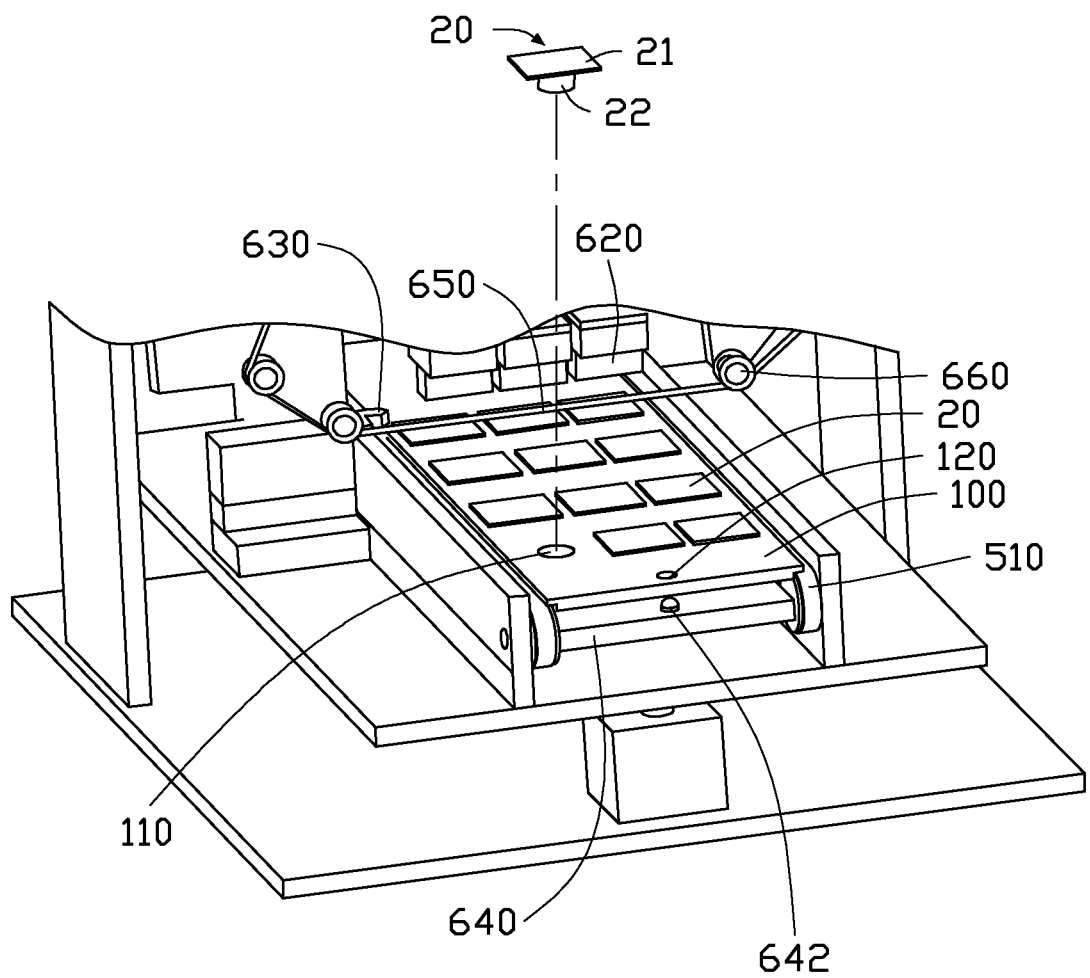
FIG. 2 is an isometric schematic view of a hot pressing station of the apparatus of FIG. 1.

Referring to FIG. 2, the hot pressing device 600 includes a number of hot pressing stations 610 arranged along each pair of second belts 510. Each hot pressing station 610 includes a number of hot pressing heads 620 arranged along a direction that is substantially perpendicular to a transferring direction of the pair of second belts 510. The number of hot pressing stations 610 in each pair of second belts 510 is equal to the number of rows in each array of receiving holes 100 (six in this embodiment). The number of the hot pressing heads 620 in each hot pressing station 610 is equal to the number of columns in each array of receiving holes 110 (three in this embodiment). The n-th hot pressing station 610, in order from a near-end to a far-end of the surface mounting device 400, is configured for merely pressing the stiffeners 30 and the workpieces 20 together, which are received in the n-th row of receiving holes 110, in an upstream direction order of the trays 100. The n-th number is a positive inter and is smaller than the number of rows of the receiving holes 110 in each tray 100.

Each hot pressing station 610 also includes a stopping block 630 movably arranged adjacent to the pair of second belts 510. Each stopping block 630 causes each tray 100 to stop at a hot pressing station 610 such that the hot pressing heads 612 align with a row of receiving holes 110.

Each hot pressing station 610 also includes a lifting platform 640. Each lifting platform 640 lifts the tray 100 which has been stopped by a stopping block 630.

Each tray 100 defines a positioning hole 120. Each lifting platform 640 includes a positioning pin 642, which is insertable into a positioning hole 120 to precisely locate a tray 100 on the lifting platform 640.

Each hot pressing station 610 includes a buffer tape 650 which is stretched between the hot pressing heads 620 and the lifting platform 640. Each buffer tape 650 acts as a buffer to soften the impact of the hot pressing head 620 hitting workpiece 20.

Each hot pressing station 610 includes a winding device 660. The winding device 660 winds on the buffer tape 650 when the elasticity of a portion of the buffer 650 which has been subjected to hitting impacts is deemed to have become insufficient.

In other embodiments, the second transferring device 500 has only one pair of second belts 510.

The above particular embodiments are shown and described by way of illustration only. The principles and the features of the present disclosure may be employed in various and numerous embodiments thereof without departing from the scope of the disclosure as claimed. The above-described embodiments illustrate the possible scope of the disclosure but do not restrict the scope of the disclosure.

What is claimed is:

1. An apparatus, comprising:
a plurality of trays for receiving a plurality of workpieces, each of which comprises a flexible printed circuit board (FPCB) and a lens module positioned on the FPCB;
a tray sender;
a first transferring device, the tray sender being configured for sending each tray into the first transferring device;
a surface mounting device, the first transferring device being configured for transferring each tray from the tray sender to the surface mounting device, the surface mounting device being configured for loading with a plurality of stiffeners and configured for pasting each stiffener to a corresponding FPCB, opposite to a corresponding lens module;
a second transferring device;
a tray collector, the second transferring device being configured for transferring each tray from the surface mounting device to the tray collector, the tray collector being configured for collecting the trays; and
a hot pressing device located between the surface mounting device and the tray collector and configured for hot pressing each stiffener to the corresponding workpiece to fixedly secure each stiffener to the corresponding workpiece to form a camera module.

2. The apparatus of claim 1, wherein each tray defines an array of receiving holes, each of which is configured for receiving a corresponding lens module.

3. The apparatus of claim 2, wherein a column direction of each array of the receiving holes is substantially parallel with a transferring direction of each tray from the tray sender to the first transferring device, to the surface mounting device, to the second transferring device, to the hot pressing device, and to the tray collector.

4. The apparatus of claim 3, wherein the second transferring device comprises a pair of belts.

5. The apparatus of claim 4, wherein the hot pressing device comprises a plurality of hot pressing stations arranged along the pair of belts, each hot pressing station comprises a plurality of hot pressing heads arranged along a direction that is substantially perpendicular to a transferring direction of the pair of belts, the number of the hot pressing stations is equal to the row number of the receiving holes in each tray, the number of the hot pressing heads in each hot pressing station is equal to the column number of the receiving holes in each tray, the n-th hot pressing station, in this order from a near-end to a far-end of the surface mounting device, is configured for only pressing the stiffeners and the workpieces, which are received in the n-th row of receiving holes, in this order of an upstream direction of the trays, wherein n is a positive integer and is smaller than the row number of the receiving holes in each tray.

6. The apparatus of claim 5, wherein each hot pressing station comprises a stopping block movably arranged adjacent to the pair of belts, each stopping block is configured for stopping each tray at the corresponding hot pressing station such that the corresponding hot pressing heads align with the corresponding row of receiving holes, respectively.

7. The apparatus of claim 6, wherein each hot pressing station comprises a lifting platform, each lifting platform is configured for lifting the corresponding tray which is stopped by the corresponding stopping block.

8. The apparatus of claim 7, wherein each tray defines a positioning hole, each lifting platform comprises a positioning pin, which is insertable into a corresponding positioning hole to position the corresponding tray on the corresponding lifting platform.

9. The apparatus of claim 8, wherein each hot pressing station comprises a buffer tape which is stretched between the corresponding hot pressing heads and the corresponding lifting platform and is configured for buffering hitting of the corresponding hot pressing heads to the workpieces.

10. The apparatus of claim 9, wherein each hot pressing station comprises a winding device, the winding device is configured for winding the buffer tape when elasticity of a portion of the buffer tape which is subjected to hitting is deemed to be insufficient.

* * * * *